United States Patent [19]
Gates et al.

[11] Patent Number: 6,052,519
[45] Date of Patent: Apr. 18, 2000

[54] COMPUTER SIMULATION OF MAGNETIC RESONANCE SPECTRA EMPLOYING HOMOTOPY

[75] Inventors: Kevin E. Gates; Graeme R. Hanson; Kevin Burrage, all of Queensland, Australia

[73] Assignee: The University of Queensland, Australia

[21] Appl. No.: 08/994,360

[22] Filed: Dec. 19, 1997

[30] Foreign Application Priority Data

Dec. 20, 1996 [AU] Australia ................................. PO4277

[51] Int. Cl.⁷ .................................................. G06F 17/50
[52] U.S. Cl. ................. 395/500.27; 395/500.23; 395/500.26
[58] Field of Search ..................... 364/578, 577, 364/723; 204/157.22; 395/500.27, 500.26, 500.23

[56] References Cited

U.S. PATENT DOCUMENTS 5,850,229  12/1998  Edelsbrunner et al. ................. 345/473

*Primary Examiner*—Kevin J. Teska
*Assistant Examiner*—Thai Phan
*Attorney, Agent, or Firm*—Nixon & Vanderhye P.C.

[57] ABSTRACT

Homotopy principles are used in computer simulation of magnetic resonance spectra. Multidimensional homotopy provides an efficient method for accurately tracing energy levels, and hence transitions, in the presence of energy level anticrossings and looping transitions. The application describes the implementation of homotopy to the analysis of continuous wave electron paramagnetic resonance spectra. The method can also be applied to electron nuclear double resonance, electron spin echo envelope modulation, solid state nuclear magnetic resonance and nuclear quadrupole resonance spectra.

14 Claims, 3 Drawing Sheets

COMPUTER SIMULATION OF MAGNETIC RESONANCE SPECTRA EMPLOYING HOMOTOPY

The invention described herein relates to the computer simulation of randomly orientated magnetic resonance spectra using multidimensional homotopy. The invention will be described with particular reference to its application to continuous wave electron paramagnetic resonance (CW-EPR) spectroscopy, but homotopy can also be employed, for example, in the simulation of field dependent electron nuclear double resonance (ENDOR) and electron spin echo envelope modulation (ESEEM), pulsed ENDOR, solid state nuclear magnetic resonance (NMR) and nuclear quadrupole resonance spectra.

BACKGROUND ART

Multifrequency electron paramagnetic resonance (EPR) spectroscopy, also called electron spin resonance [1, 2, 3] is a powerful tool for characterising paramagnetic molecules or centres within molecules that contain one or more unpaired electrons. EPR spectra from these systems are often complex and can be interpreted with the aid of a spin Hamiltonian. For an isolated paramagnetic centre (A) a general spin Hamiltonian is [1–3]:

$$H_A = S \cdot D \cdot S + \beta B \cdot g \cdot S + S \cdot A \cdot I + I \cdot Q \cdot I - \gamma I \cdot (I - \sigma) \cdot B \quad (1)$$

where S and I are the electron and nuclear spin operators respectively, D is the zero field splitting tensor, g and A are the electron Zeeman and hyperfine coupling matrices respectively, Q is the quadrupole tensor, $\gamma$ the nuclear gyromagnetic ratio, $\sigma$ the chemical shift tensor, $\beta$ the Bohr magneton and B the applied magnetic field.

Additional hyperfine, quadrupole and nuclear Zeeman interactions will be required when superhyperfine splitting is resolved in the experimental EPR spectrum. When two or more paramagnetic centres ($A_i$, i=1, . . . , N) interact, the EPR spectrum is described by a total spin Hamiltonian ($H_{Total}$) which is the sum of the individual spin Hamiltonians ($H_{A_i}$, Eqn 1) for the isolated centres ($A_i$) and the interaction Hamiltonian ($H_{A_{ij}}$) which accounts for the isotropic exchange, antisymmetric exchange and the anisotropic spin-spin (dipole-dipole coupling) interactions between a pair of paramagnetic centres [2–5].

$$H_{TOTAL} = \sum_{i=1}^{N} H_{Ai} + \sum_{i,j=1, j \neq i}^{N} H_{Aij} \quad (2)$$

$$H_{Aij} = J_{Aij} S_{A_i} \cdot S_{A_j} + d_{Aij} S_{A_i} \times S_{A_j} + S_{A_i} \cdot D_{Aij} \cdot S_{A_j}$$

Computer simulation of the experimental randomly orientated or single crystal EPR spectra from isolated or coupled paramagnetic centres is often the only means available for accurately extracting the spin Hamiltonian parameters required for the determination of structural information [2–8]. Computer simulation of randomly orientated EPR spectra is performed in frequency space through the following integration [3,9]

$$S(B, v_c) = \sum_{i=0}^{M} \sum_{j=i+1}^{M} C \int_{\theta=0}^{\pi} \int_{\phi=0}^{\pi} |\mu_{ij}|^2 f[v_c - v_0(B), \sigma_v] d\cos\theta d\phi \quad (3)$$

where $S(B, v_c)$ denotes the spectral intensity, $|\mu_{ij}|^2$ is the transition probability, $v_c$ the microwave frequency, $v_o(B)$ the resonant frequency, $\sigma_v$ the spectral line width, $f[v_c - v_o(B), \sigma_v]$ a spectral lineshape function which normally takes the form of either Gaussian or Lorentzian, and C a constant which takes care of all the other experimental parameters. The summation is performed over all the transitions (i,j) contributing to the spectrum and the integration is performed over half of the unit sphere (for ions possessing triclinic symmetry), a consequence of time reversal symmetry [1, 3]. For paramagnetic centres with symmetries higher than triclinic only one or two octants are required.

Unlike most other spectroscopic techniques (nuclear magnetic resonance, infrared and electronic absorption spectroscopy) which are frequency swept, EPR is a field-swept technique. In other words, the resonance condition $[hv_c = E_i(B_{res}) - E_j(B_{res})$; where $E_i$ and $E_j$ are the energies (eigenvalues) of the two spin states (eigenvectors) involved in the transition] is achieved by sweeping the magnetic field (varying $B_{res}$ and hence $E_i$ and $E_j$).

The methods used for determining $B_{res}$ in the computer simulation of EPR spectra can be broadly classified into two categories, namely perturbation and matrix diagonalisation methods.

In perturbation methods the energies of the spin states as a function of the field strength B are obtained from analytical expressions. This approach is computationally inexpensive but is limited largely to systems in which a dominant interaction exists and all the other interactions can be treated approximately as perturbations. This approach has been predominantly used to extract spin Hamiltonian parameters from EPR spectra of isolated paramagnetic centres which contain a single unpaired electron (S=½) [2, 3, 10–16] and exchange or dipole—dipole coupled binuclear centres ($S_{A_1} = S_{A_2} = ½$) [2–5].

The second category involves matrix diagonalization and must be employed for calculating the eigenvalues and eigenvectors when perturbation theory breaks down (i.e. two or more interactions have comparable energies). While the eigenvalues are used to calculate $B_{res}$, the eigenvectors are used to calculate the transition probability $|\mu_{ij}|^2$ [3].

In theory, this approach is general and can be applied to any spin system of choice. However, the numerical integration given in Eqn. 3 can be very time-consuming as the searching process of $B_{res}$ for a given transition involves substantial computation and this resonance searching process has to be repeated for every transition and for every orientation of the magnetic field. This often involves a very large number (100,000 or more) of matrix diagonalizations. Currently the most efficient algorithms for Hermitian matrix diagonalization are cubic processes $O(N^3)$ (where N is the order of the matrix) [27]. In addition memory requirements can be substantial if the spin space becomes large. Examples of computer simulation software which use this approach to simulate spectra from isolated paramagnetic centres include QPOW [18], EPR.FOR [19], MAGRES [20, 21] and MSPEN/MSGRA [22].

The method described in the international patent application no. PCT/AU96/00534 for computer reconstruction of randomly orientated powder spectra in magnetic resonance, known as the "Sophe" method, features matrix diagonalisation, a segmentation method employing second order eigenfield perturbation theory allowing $B_{res}$ to be determined quickly, a new scheme for partitioning the unit sphere and the extremely efficient global cubic spline and local linear interpolation schemes for reducing the number of $\theta$ and $\phi$ orientations [23–25] while a 26 fold reduction in computational time can be achieved in the simulation of a orthorhombic Cr(III) EPR spectrum using Sophe, even larger reductions can be obtained with larger spin systems. The Sophe computer simulation software package allows the simulation of randomly orientated powder spectra described by either Eqn. 1 or Eqns. 1 and 2 for all spin spin systems (i.e. $S_A \geq \frac{1}{2}$ or $S_{A_i} \geq \frac{1}{2}$, $S_{A_j} \geq \frac{1}{2}$: i, j=1, . . . , N) [23–25] and can easily be extended to other types of randomly orientated powder spectra in magnetic resonance. In the Sophe method [23,24], $B_{res}$ are calculated by matrix diagonalization only at a number of selected orientations which constitute the vertices of a given Sophe grid, (typically 190 orientations/ vertices for orthorhombic symmetry). For all other orientations (normally in the thousands), $B_{res}$ and $|u_{ij}|^2$ are obtained through the Sophe interpolation scheme. Such an approach has been demonstrated to be highly successful for simulating complicated EPR spectra [26–28].

However all computer simulation programmes, including Sophe, that employ matrix diagonalization, are not able to perform the following functions satisfactorily:

(a) tracing of a given transition as a function of orientation in the presence of energy level anti-crossing [29], (b) tracing of looping transitions [29], (c) performing the simulations in frequency space [9], and (d) calculation of the transition probability across a resonant line.

Thus, although the complete matrix diagonalization approach is far superior to perturbation methods, both methods are incapable of tracing the eigenpairs of the matrix to be traced from one field position to another nearby position when there are holes in a transition surface, anti-level crossings, and looping transitions.

SUMMARY OF THE INVENTION

This invention provides a method of computer simulation of magnetic resonance spectra which overcomes or ameliorates the above difficulties, by using homotopy.

In other unrelated fields, the "homotopy" method, also known as the continuation or embedding method, has been shown to be efficient and useful for tracing eigenvalues and eigenvectors of a known diagonalization to an unknown diagonalization [30, 31]. It has also been used to compute the complete eigendecomposition of symmetric tridiagonal matrices. Homotopy works by constructing a function which connects through smooth curves the eigenvalues and eigenvectors of one matrix to another. However, homotopy has not hereto been applied to the computer simulation of magnetic resonance spectra.

This invention uses the homotopy method to trace the eigenvalues and eigenvectors (termed an eigenpair) for a given spin system as a function of orientation and magnetic field. Consequently, given a fixed microwave quantum ($h\nu_c$), transitions between a pair of eigenvectors can also be traced as function of orientation and magnetic field, producing a complete eigensurface of eigenvalues and associated eigenvectors. This surface is called a "transition surface." The tracing of this surface enables homotopy to uniquely follow the transition surface in the vicinity of anti-level crossings and looping transitions. Since the eigenvalues and eigenvectors are known as a function of orientation and magnetic field, the simulation of magnetic resonance spectra and in particular continuous wave EPR spectra can be correctly performed in frequency space.

In the preferred embodiment, the initial step is the construction of a spin Hamiltonian matrix (H) based on an appropriate spin Hamiltonian (Eqns. 1 or 1 and 2). This results in a matrix function in three variables, the Euler angles θ and φ, which reflect the angular dependence of the transitions, and the magnetic field B. For ease in further calculations this Hamiltonian matrix is split into field independent $H_{indep}$ and dependent $H_{dep}$ (θ, φ, B) components. The eigenvalues (E) and eigenvectors (ψ) at an initial orientation, for example θ=φ=0°, are calculated from this matrix by solving the eigenvalue problem (Hψ=Eψ). The second step is to locate the resonant field positions $B_{res}$ using the resonance condition $$F = \Delta E = h\nu_c = E_i(\theta_i, \phi_i, B_{res}) E_j(\theta_i, \phi_i, B_{res}) \tag{4}$$

for an initial set of Euler angles and a constant microwave quantum. The result of this search algorithm is two eigenpairs, corresponding to each transition, and a corresponding resonant field strength $B_{res}$. The search method applied in this instance may be the method described later. The probability of observing a transition between the pair of eigenvectors can be calculated by applying a mathematical formula to the eigenvectors.

The third step is to keep the magnetic field strength constant and calculate the resonant energy difference between the eigenvalues based strictly on changes to the Euler angles. In particular, the energy levels are traced from one fixed position $(\theta_0, \phi_0,)$ to another fixed position $(\theta_1, \phi_1)$ which involves a change in one or both of the Euler angles. From the theory developed for the homotopy method, for an energy level $E(\theta_0, \phi_0, B_0)$ with a corresponding eigenvector $\psi(\theta_0, \phi_0, B_0)_i$ [31], the derivative (E') of the eigenvalue $E_i$ with respect to the homotopy variable T is given by $$E'_i(\theta_0,\phi_0,B_0)_i = \psi_i(\theta_0,\phi_0,B_0)^T (H(\theta_0,\phi_0,B_0) - H(\theta_1,\phi_1,B_1)) \psi_i(\theta_0,\phi_0,B_0)$$

This equation is equivalent to the Rayleigh quotient [33] of the difference of the field dependent Hamiltonian at the two points. By using this formula and varying θ, φ and B, an approximate spatial derivative of the eigenvalue can be found, and thus the change in spin state due to spatial variations. From the derivatives for the two eigenvalues of interest, the eigenvalues at the new orientation $(\theta_1, \phi_1)$ can be estimated. With these estimates of the new eigenvalues, the eigenvectors can be found by iteratively solving the equation $$H(\theta_1,\phi_1,B_0) - E_i(\theta_1,\phi_1,B_0))\psi_i(\theta_1,\phi_1,B_0) = 0 \tag{6}$$

A better estimate of the eigenvalue can be obtained from the Rayleigh quotient [33] of the new eigenvector, $$E(\theta_1,\phi_1,B_0) = \psi_i(\theta_1,\phi_1,B_0)^T H(\theta_1,\phi_1,B_0) \psi_i(\theta_i,\phi_i,B_0) \tag{7}$$

and a new eigenvector calculated corresponding to this new engenvalue. Thus we iterate between estimates of the eigenvalue and the eigenvector until convergence, or the maximum number of iterations (defined) is exceeded. If the maximum number of iterations is exceeded for either eigenvalue, the total spatial distance is halved, and this step is repeated.

After having independently traced the two eigenpairs of interest from one spatial location (θ, φ) to another, the next step, step four, is to find the resonant field positions at the new orientation, or trace the transition across the resonant field position. This is accomplished by using another variation of the Homotopy algorithm. In this case we must satisfy the resonance condition (Eqn. 4).

From Eqns. 4 and 5 where B is varied and θ and φ are held constant, we can find the derivative of the function F at $(\theta_1, \phi_1, B_0)$ $$F'_B = E'_i(\theta_1,\phi_1,B_0) E'_j(\theta_1,\phi_1,B_0) \tag{8}$$

We can now update the correction to the resonant field position $B_{res}$.

$$\Delta B = B_0 F / F'_B$$

$$B_1 = B_0 + \Delta B \quad (9)$$

Using this new value for B we can update the energies, $E_i$ and $E_j$ with the Rayleigh Quotients method and check the resonance condition (Eqn. 4). If the condition is not satisfied we continue to take new steps $\Delta B$ until eqn. 4 is satisfied, or until the maximum number of steps (defined) is exceeded. Upon convergence we return to step three and take a new spatial step. In general, this step $\Delta B$ is confirmed to be within some tolerance range, if this is not achieved, or if too many steps are required, then the algorithm goes back to step three halving the total spatial distance. This method will allow the calculation of the transition probability (from the eigenvectors) across a given transition line and in turn enables simulations to be performed in frequency space.

The homotopy method of this invention can be implemented within the Sophe electron paramagnetic simulation package, wherein it is used to find the eigenvalues and associated eigenvectors of the special class of matrices generated in the computer simulation of magnetic resonance spectra. In particular, by directly tracing the eigenfunctions in parameter space it can perform the functions (a) through (c) above. Since this method is also theoretically less expensive than matrix diagonalization, when combined with the Sophe grid it may result in significant reductions in the computational time for the simulation of EPR spectra. Homotopy may also be used in conjunction with other partition schemes, for example the "Apple-peel" [3], "Igloo" [18], "Spiral" [19], and "Triangular" [34] methods and/or perturbation methods.

In order that the invention may be more fully understood and put into practice, a preferred embodiment thereof will now be described with reference to the accompanying drawings.

DESCRIPTION OF PREFERRED EMBODIMENT

Figure 1A:
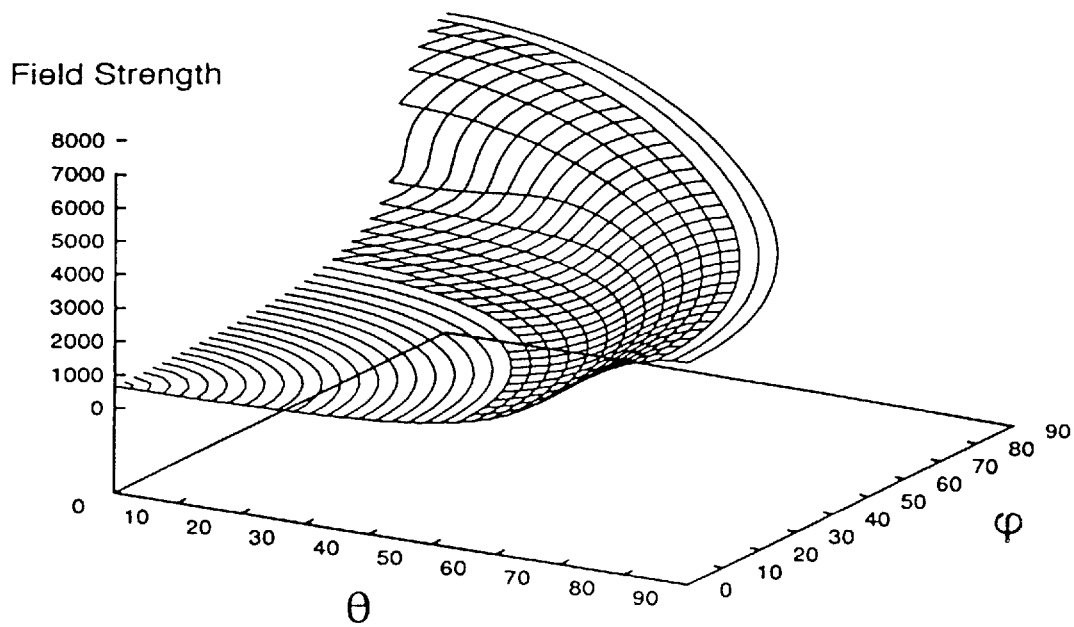
FIG. 1: Transition surface between levels 5 and 6 as a function of $\theta$, $\phi$, B for a high spin Fe(III) complex (D=0.1 cm$^{-1}$, E/D=0.25, g=2.0, $\nu$=9.0 GHz). Calculated using (a) homotopy and (b) matrix diagonalization, Sophe.

The basis of homotopy is the construction of smooth curves which connect the eigenpairs of one matrix to another. In the context of EPR simulations, $B_{res}$ is assumed to be known (calculated using matrix diagonalization, perturbation theory or any other method) for some starting orientation.

The implementation of homotopy to the analysis of randomly orientated EPR spectra is described below.

```
Set up Hamiltonian matrix defined by Eq. [1] and [2] (Step 1)
    calculate the eigenvectors and eigenvalues at θ₀,φ₀ by
solving Hψ = Eψ
Locate resonant field positions B_res (Step 2)
Trace Eigenpath from θ₀,φ₀ to θ₁,φ₁ (Step 3)
    Set the tolerance δ, the maximum iteration number, n
    Δθ and Δφ
    θ = θ₀ + Δθ
    φ = φ₀ + Δφ
    Do
        Use E(θ₀,φ₀,B₀) and E'(θ₀,φ₀,B₀) to predict E(θ,φ,B₀)
        Call Rayleigh Quotient Iteration (H,E_i(θ,φ,B₀),
ψ_i(θ,φ,B₀),n,δ)
        Call Rayleigh Quotient Iteration (H,E_j(θ,φ,B₀),
ψ_j(θ,φ,B₀),n,δ)
        If Rayleigh Quotient Iteration converged
            θ₁ = θ
            φ₁ = φ
            Exit
        Else
            Δθ = Δθ/2
            θ = θ₀ + Δθ
            Δφ = Δφ/2
            φ = φ + Δφ
        End if
    While Rayleigh Quotient has not converged
End
Find the resonant field position B_res (Step 4)
    Set the tolerance δ and the maximum iteration number, n.
    B = B₀
    Do
        F_B = E_i(θ₁, φ₁, B) - E_j(θ₁, φ₁, B)
        F_B' = E_i'(θ₁, φ₁, B) - E_j'(θ₁, φ₁, B)
        ΔB = -F_B/F_B'
        B = B + ΔB
        Call Rayleigh Quotient Iteration (H,E_i(θ₁,φ₁,B),
ψ_i(θ₁,φ₁,B₀),n,δ)
        Call Rayleigh Quotient Iteration (H,E_j(θ₁,φ₁,B),
ψ_j(θ₁,φ₁,B),n,δ)
        If Rayleigh Quotient Iteration converged
            B_res = B
            Exit
        Else
            Δθ = Δθ/2
            θ = θ₀ + Δθ
            Δφ = Δφ/2
            φ = φ₀ + Δφ
            Go to Step 3
        End if
    End do
End
```

The Rayleigh quotient iteration method [33], is used to determine both the eigenvalue and eigenvector of a symmetric matrix.

```
Rayleigh Quotient Iteration (H,E,ψ,n,δ)
    ψ₀ = ψ/‖ψ‖
    μ₀ = E
    For i = 0, ..., n - 1
        y_i = (H - μ_iI)⁻¹ψ_i
        ψ_{i+1} = y_i/‖y_i‖
        μ_{i+1} = ψ_{i+1}^T H ψ_{i+1}
        If (‖μ_{i+1} - μ‖ < δ)then
            λ = μ_{i+1}
            ψ = ψ_{i+1}
            Return success
        End if
    End for loop
    Return failure
End
```

Application of homotopy to a monotonically varying transition surface (for example FIG. 1) is fairly straightforward. Given a single point on the surface, a method could just produce a line of eigenpair points along the θ axis, and then from every point on the line sweep out along the φ axis. However, such an algorithm will not find the complete surface if looping transitions are present (FIG. 2). Using this fundamental method, there are three possible cases when the surface will not completed. The first two cases involve the comparison between two adjacent lines (i.e. two lines along the φ axis). If one line turns and the other doesn't, or if there is a great difference in B values between adjacent points, then part of the surface could be missing, for example FIG. 3b. The third case is a surface that has a fairly complicated boundary and does not exist for the entire spatial dimension field.

The following modifications to homotopy described herein provides a solution to these problems. In step three, homotopy attempts to trace the eigenvalues from one angular position to another. If homotopy is unsuccessful, then the spatial distance is halved and the step is repeated. If the spatial distance falls below a certain level, then there are two possibilities—either the edge of the surface has been reached or a turn has been found. To investigate the possibility of a turn, homotopy is used to trace the eigenvalues in the reverse spatial direction. There is then the problem of whether a turn is being followed, or whether the previously found eignepairs are being rediscovered. To ensure that a turn is indeed being followed, the adjustments of B are checked. In general when B is adjusted, ΔB is confined to be within plus or minus a given tolerance, otherwise an error is produced. In the vicinity of a possible turn, ΔB is restricted further. If B was increasing prior to the possible turn, then B is confined to increase after then turn. If B was decreasing before the turn, then it will decrease after the turn. If homotopy continues to find eigenvalues with these restrictions imposed then a turn occurred, otherwise the edge of the surface was found.

A comparison of the complexity analyses for matrix diagonalization (~1000 $N^3$ $m^2$) and the homotopy-based method of this invention (~4/3 d $N^3m^2$), in Table 1, shows that providing the number of transitions (d) is less than 75, the homotopy-based method will be computationally more efficient than matrix diagonalization.

This method was tested on a high spin Fe(III) system S=5/2 (D=0.1 cm$^{-1}$, E/D=0.25, g=2.0) for which the second order fine structure spin Hamiltonian is $$H = g\beta B \cdot S + D[S_z^2 - \tfrac{1}{3}S(S+1)] + E(S_x^2 - S_y^2) \quad (10)$$

With the microwave quantum (ν=9.0 GHz) set to be slightly smaller than the zero-field splittings, multiple transitions can occur between a given pair of energy levels. For example, between levels 2 and 4 (numbered in increasing energy), three transitions at $B_{res}$=3.525, 189.2 and 235.50 mT are detected.

Figure 1B:
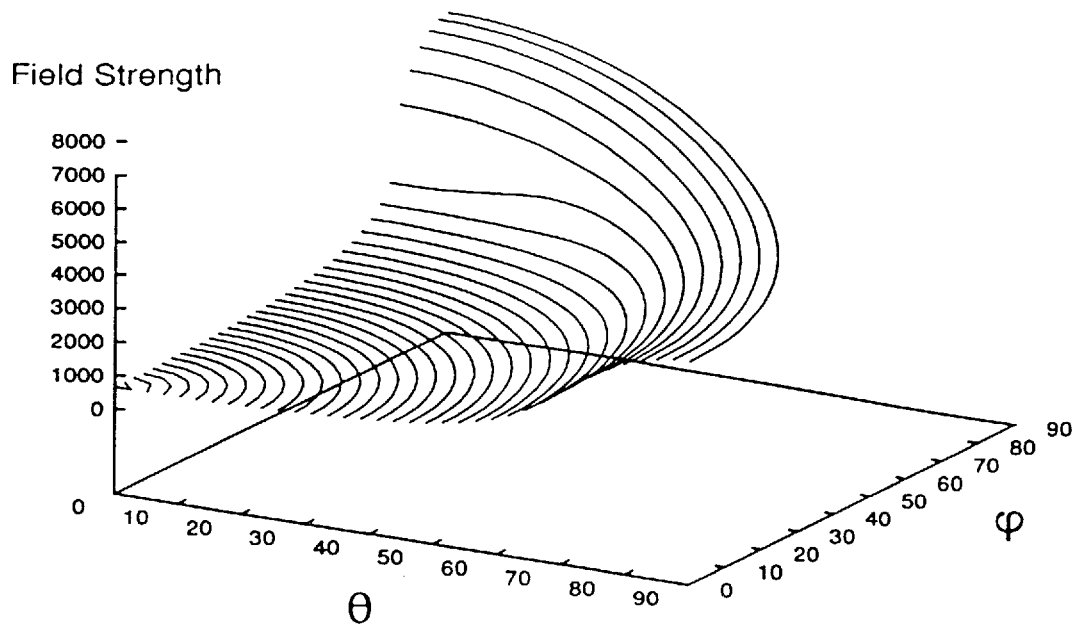

The power of homotopy in comparison to matrix diagonalisation is clearly demonstrated in FIGS. 1, 2, and 3 which compare transition surfaces from the two methods for particular transitions arising from an S=5/2 spin system. FIG. 1 shows the transition surfaces for levels 5 and 6. The homotopy surface (FIG. 1a) shows exactly the same structure as calculated by matrix diagonalization (FIG. 1b). This transition surface varies monotonically as a function of the Euler angles and the magnetic field B.

Table 2 gives the results of comparison between homotopy and the matrix diagonalization, where the following information is given in the columns:

1. the transition levels,
2. the relative difference (RA) between the Sophe points calculated using the two methods, $$RA = 1/n * \frac{\sum |B_{Matrix\ Diagonalisation} - B_{Homotopy}|}{B_{Homotopy}} \quad (11)$$

3. the total number of Sophe points computed,
4. the number of erroneous data points where the magnetic filed value for matrix diagonalization and homotopy do not agree, or where matrix diagonalizsation found an erroneous B value and
5. the number of multiple valued Sophe points calculated by homotopy for which the matrix diagonalization routine may have calculated multiple points by Sophe was unable to complete the surface. Consequently only the lowest valued point has been reported.

Figure 2A:
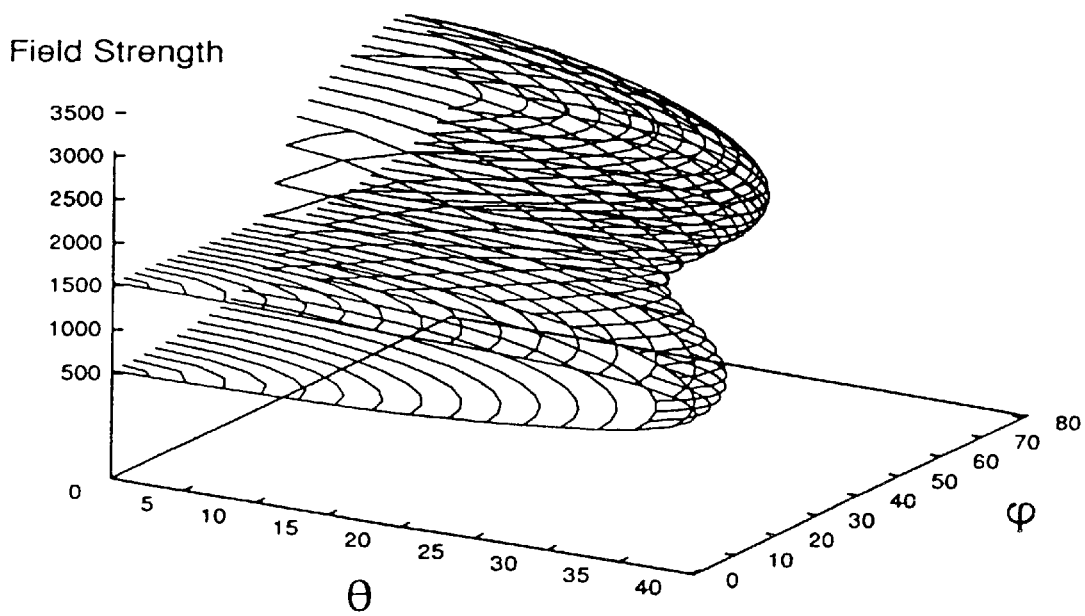
FIG. 2: Transition surface between levels 3 and 5 as a function of $\theta$, $\phi$, B for a high spin Fe(III) complex (D=0.1 cm$^{-1}$, E/D=0.25, g=2.0, $\nu$=9.0 GHz). Calculated using (a) homotopy and (b) matrix diagonalization, Sophe.
Figure 2B:
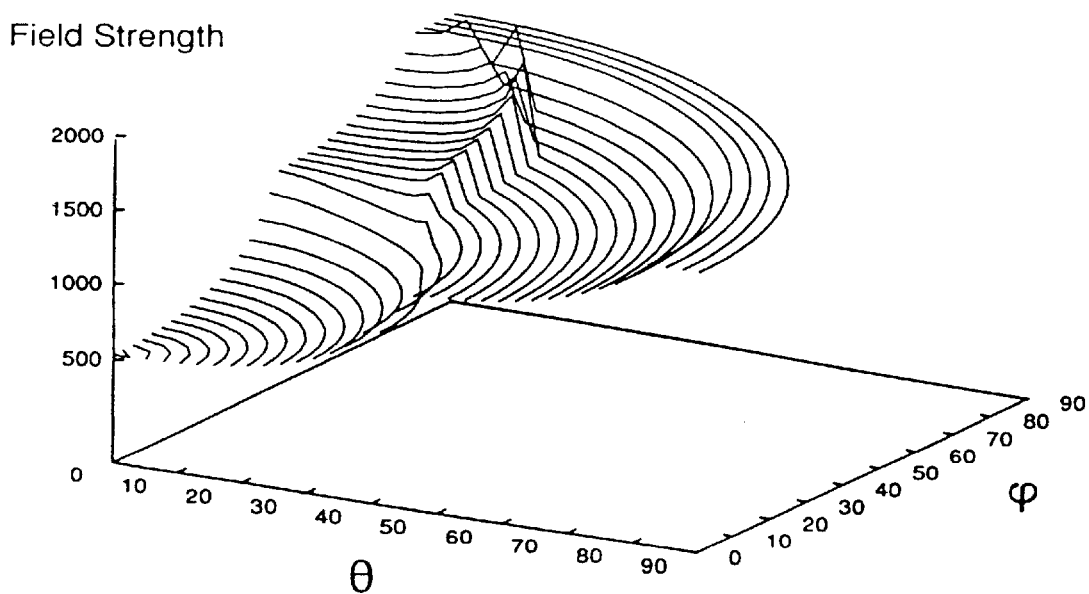

Clearly, homotopy reproduces the surface obtained by matrix diagonalization between levels 5 and 6 as the relative error between the two methods is very small (4.104334× 10$^{-5}$). The transition surface from level 3 to level 5 is a looping transition as shown in FIG. 2a, which is produced by homotopy, but not by matrix diagonalization (FIG. 2b). In fact, matrix diagonalization calculates an erroneous surface since no transitions between levels 3 and 5 exist when θ>40°.

Figure 3A:
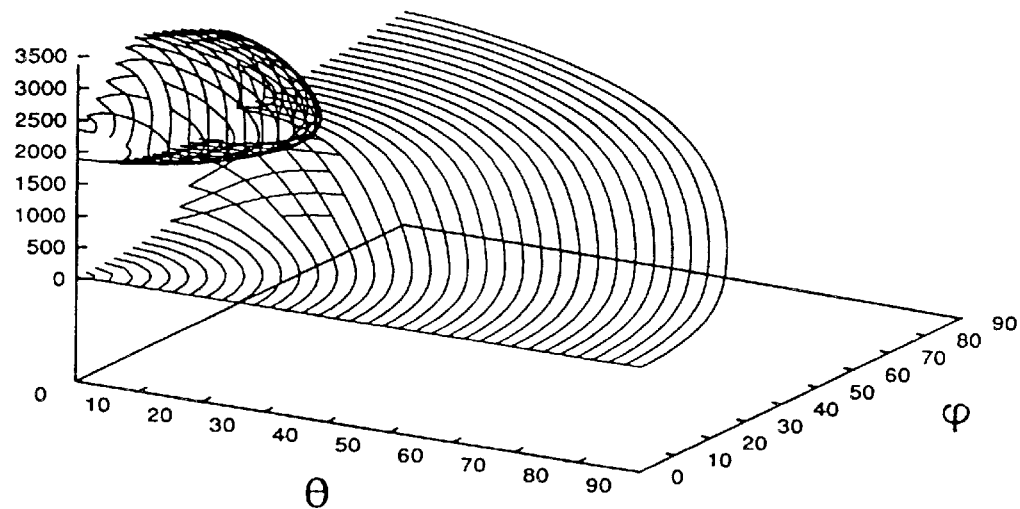
FIG. 3: Transition surface between levels 2 and 4 as a function of $\theta$, $\phi$, B for a high spin Fe(III) complex (D=0.1 cm$^{-1}$, E/D=0.25, g=2.0, $\nu$=9.0 GHz). Calculated using (a) homotopy and (b) matrix diagonalization, Sophe.
Figure 3B:
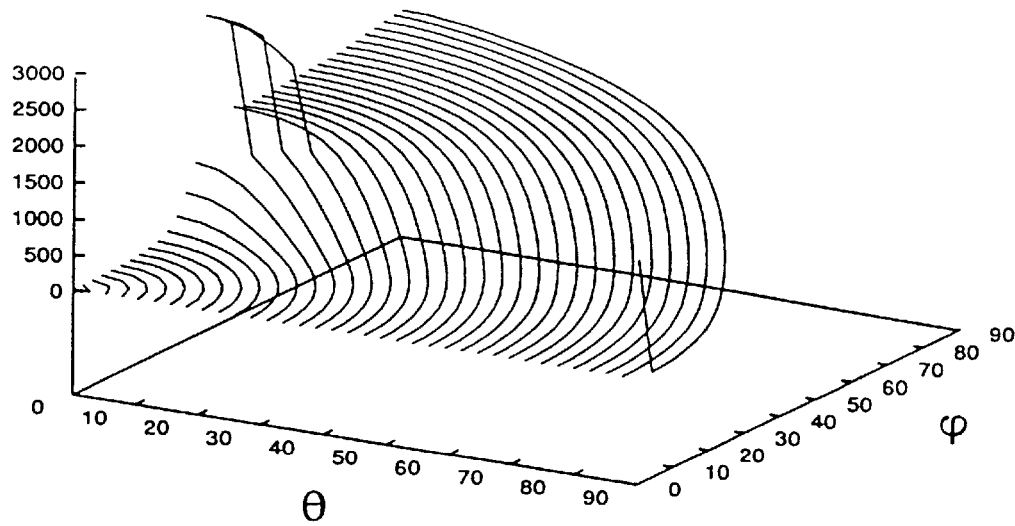

In FIG. 3 an anti-level crossing between levels 2 and 4 is graphed. Homotopy (FIG. 3a) resolves the complete structure while matrix diagonalization completes only the mostly monotonic lower transition (FIG. 3b). In this case matrix diagonalization may have found multiple points. Matrix diagonalization may have discarded some points in completing the surface, as it is unable to make a connection between the multivalued points. Note that the unmatched homotopy points indicate structure not revealed with matrix diagonalization, while the points where matrix diagonalization and homotopy do not agree indicate erroneous points calculated by matrix diagonalization.

The homotopy method is not only capable of obtaining $B_{res}$ but also automatically establishes the connection for $B_{res}$ between the grid points. This will allow the highly efficient Sophe interpolation scheme to be used to interpolate $B_{res}$ at any point between the grid points. In addition, homotopy does a search in frequency space for the resonant frequency. During the search for the resonant frequency, the eigenvectors and eigenvalues are calculated at various points across a given resonance. While the eigenvalues are required to calculate the line shape, the eigenvectors may be used to calculate the transition probability, which is known in some spin systems to vary across resonances. Thus, homotopy allows computer simulation of spectra in frequency space, which is the correct way of simulating spectra. Since homotopy traces the eigenpairs it will automatically solve the energy level anti-crossing problem and the looping transition problem. In conjunction with Sophe the homotopy method leads to improved quality of simulated spectra, allows the analysis of more complicated EPR spectra and reduces the computational time.

Although the invention has been described with particular reference to computer simulation of CW-EPR spectra, the method of this invention can be used, with appropriate modification where necessary, for the simulation of field dependent ENDOR, ESEEM, pulsed ENDOR, solid state NMR and nuclear quadrupole resonance spectra.

TABLE 1

| Procedure | Computation Time |
|---|---|
| Matrix Diagonalization | |
| Tri-diagonalize H matrix. | $2/3\ N^3$ |
| Diagonalize H matrix with an iterative QR method[1] | $8-10\ N^3$ |
| Repeat diagonalization 200 times for each orientation $(\theta,\phi)$. | $\sim 2000\ N^3$ |
| Total Computation Time for $m^2/2$ orientations. | $\sim 2000\ N^3\ m^2/2$ |
| Homotopy | |
| Tri-dagonalize H matrix. | $2/3\ N^3$ |
| Rayleigh Quotient Iteration[2] | $15-20\ N$ |
| Find $\Psi$ from the original H matrix. | $2\ N^2$ |
| Repeat $\sim 4$ times to trace transition surface from one orientation to another. | $\sim 8/3\ N^3$ |
| This calculation is repeated for d allowed transitions. | $\sim 8/3\ d\ N^3$ |
| Total Computation Time for $m^2/2$ angular orientations. | $\sim 8/3\ d\ N^3\ m^2/2$ |

[1] Determine all E, $\Psi$ of tri-diagonal H matrix.
[2] Using the tri-diagonal H matrix.

TABLE 2

| Levels | | Relative Accuracy (RA) | Total SOPHE points(n) | Erroneous data points[1] | Unmatched Homotopy points[2] |
|---|---|---|---|---|---|
| 2 | 4 | $1.071440 \times 10^{-3}$ | 666 | 2 | 156 |
| 3 | 5 | $1.025706 \times 10^{-4}$ | 666 | 411 | 255 |
| 5 | 6 | $4.104334 \times 10^{-5}$ | 666 | 0 | 0 |

[1] The number of erroneous data points where the magnetic field value for matrix diagonalization and homotopy do not agree, or where matrix diagonalization found an erroneous B value.
[2] The number of multiple valued SOPHE points calculated by homotopy for which matrix diagonalization did not return a multiple valued point.

REFERENCES

[1] A. Abragam and B. Bleaney. Electron Paramagnetic Resonance of Transition Ions. Clarendon Press, Oxford, 1970.
[2] F. E. Mabbs and D. C. Collison. Electron Paramagnetic Resonance of Transition Metal Compounds. Elsevier, Amsterdam, 1992.
[3] J. R. Pilbrow. Transition Ion Electron Paramagnetic Resonance. Clarendon Press, Oxford, 1990.
[4] A. Bencini and D. Gatteschi. EPR of Exchange Coupled Systems. Springer-Verlag, Berlin, 1990.
[5] T. D. Smith and J. R. Pilbrow. Coord. Chem. Rev., 13:173, 1974.
[6] (a) J. D. Swalen and H. M. Gladney. IBM J. Res. Dev., 8:515, 1964. (b) J. D. Swalen, T. R. L. Lusebrink and D. Ziessow, Magn. Res. Rev., 2:165, 1973.
[7] P. C. Taylor, J. F. Baugher and H. M. Kriz. Chem. Rev., 75:203, 1975.
[8] H. L. Vancamp and A. H. Heiss. Magn. Res. Rev., 7:1, 1981.
[9] J. R. Pilbrow. Magn. Res., 58:186, 1984.
[10] G. R. Sinclair. Modelling Strain Broadened EPR Spectra. PhD thesis, Monash University, 1988.
[11] A. L. Van den Brenk, D. P. Fairlie, G. R. Hanson, L. R. Gahan, C. J. Hawkins, and A. Jones. Inorg. Chem., 33:2280, 1994.
[12] (a) D. J. Lowe. Biochem. J., 171:649, 1978. (b) G. D. Markham, B. D. Nageswara Rao and G. H. Reed. J. Magn. Res., 33:595, 1979.
[13] P. C. Talyor and P. J. Bray. J. Magn. Res., 2:305, 1970.
[14] P. H. Reiger. J. Magn. Res., 50:485, 1982.
[15] J. C. Schwatrz, B. M. Hoffman, R. J. Krijek and D. K. Atmatzidis. Magn. Res., 36:259, 1979.
[16] M. I. Scullane, L. K. White and N. D. Chasteen. J. Magn. Res., 47:383, 1982.
[17] E. Anderson, Z. Bai, C. Bischof, J. Demmel, J. Dongarra, J. Du Croz, A. Greenbaum, S. Hammarling, A. McKenney, S. Ostrouchov, and D. Sorensen. LAPACK Users' Guide. SIAM, Philadelphia, 1992.
[18] (a) R. L. Belford and M. J. Nilges. EPR Symposium 21st Rocky Mountain Conference, Denver, Colo., 1979. (b) A. M. Maurice. PhD thesis, University of Illinois, Urbana, Ill., 1980. (c) M. J. Nilges. Electron Paramagnetic Resonance Studies of Low Symmetry Nickel(I) and Molybdenum(V) Complexes. PhD thesis, University of Illinois, Urbana, Ill., 1979.
[19] M. J. Mombourquette and J. A. Weil. Simulation of Magnetic Resonance Powder Spectra. J. Magn. Res., 99:37, 1992.
[20] C. P. Keijzers, E. J. Reijerse, P. Stam, M. F. Dumont and M. C. M. Gribnau. J. Chem. Soc. Faraday Trans. I, 83:3493, 1987.
[21] M. C. M. Gribnau, J. L. C. van Tits, and E. J. Reijerse. J. Magn. Reson., 90:474, 1990.
[22] A. Kreiter and J. Hüttermann. J. Magn. Res., 93:12, 1991.
[23] D. Wang and G. R. Hanson. J. Magn. Res., Series (A) 117:1, 1995.
[24] D. Wang and G. R. Hanson. Appl. Magn. Reson., 11:401, 1996.
[25] D. Wang and Hanson G. R. Computer Simulation of Magnetic Resonance Spectra. International Patent Application no. PCT/AU96/00534, 1996.
[26] V. Grillo, G. R. Hanson, D. Wang, T. W. Hambley, L. R. Gahan, K. S. Murray, B. Moubaraki, and C. J. Hawkins. Inorg. Chem., 35:3568, 1995.
[27] L. R. Gahan, V. A. Grillo, T. W. Hambley, G. R. Hanson, C. J. Hawkins, E. M. Proudfoot, B. Moubaraki, K. S. Murray, and D. Wang. Inorg. Chem., 35:1039, 1996.
[28] W. Adam, C. van Barneveld, S. E. Bottle, H. Engert, G. R. Hanson, H. M. Harrer, C. Heim, W. M. Nau, D. Wang, J. Amer. Chem. Soc., 118,3974 (1996).
[29] D. Wang and J. R. Pilbrow. J. Magn. Res., 77:411, 1988.
[30] T. Y. Li and N. H. Rhee. Numer. Math., 55:265, 1989.
[31] M. Oettli. Technical Report 205, Department Informatik, ETH, Zürich, December 1993. and references therein.
[32] S. K. Misra and P. Vasilopoulos, J. Phys, C: Solid St. Phys., 13, (1980).
[33] G. H. Golub and C. F. Van Loan. Matrix Computations. Johns Hopkins University Press, Baltimore, Md., 1983.
[34] D. W. Alderman, M. S. Solum, and D. M. Grant. J. Chem. Phys., 84:3717, 1986.

We claim:

1. A method of computer simulation of magnetic resonance spectra, including the steps of:
    calculating eigenvalues and eigenvectors at an initial orientation defined by a pair of Euler angles,
    locating resonant magnetic field positions at the initial orientation, and tracing resonant transitions from the initial orientation to a new orientation using homotopy.

2. A method as claimed in claim 1 further including the determination of the dependent resonant field strength at the new orientation.

3. A method as claimed in claim 1 wherein the eigenvalues and eigenvectors are calculated from a spin Hamiltonian matrix.

4. A method as claimed in claim 3 wherein the Hamiltonian matrix comprises both field independent and field dependent components.

5. A method as claimed in claim 1 wherein the eigenvalues and eigenvectors are calculated from perturbation theory.

6. A method as claimed in claim 1 wherein the tracing step includes:
   calculating the corresponding eigenvalues and eigenvectors at the new orientation using homotopy, and
   locating the resonant magnetic field positions at the new orientation by the use of homotopy.

7. A method as claimed in claim 1 further comprising the step of calculating the transition probability across a given resonance.

8. A method as claimed in claim 1 including the tracing of looping transitions.

9. A method as claimed in claim 1 including the tracing of energy level crossing and anti-level crossings.

10. A method as claimed in claim 1 wherein the simulation is performed in frequency space.

11. A method as claimed in claim 1 wherein the spectra is randomly orientated continuous wave or pulsed EPR spectra, electron nuclear double resonance spectra, solid state nmr spectra or nuclear quadruple resonance spectra.

12. A method of computer simulation of magnetic resonance spectra, including the steps of:
   calculating eigenvalues and eigenvectors at an initial orientation defined by a pair of Euler angles,
   locating resonant magnetic field positions at the initial orientation, and
   tracing resonant transitions from the initial orientation to a new orientation using homotopy including determination of dependent resonant field strength at the new orientation; and wherein the step of tracing resonant transitions from the initial orientation to the new orientation includes:
      calculating resonant energy differences between the eigenvalues due to changes in the Euler angles for a constant magnetic field strength to find an approximate spatial derivative of the eigenvalues,
      estimating the eigenvalues at the new orientation using the spatial derivatives,
      calculating the eigenvectors at the new orientation from the estimated eigenvalues,
      estimating the eigenvalues from the Rayleigh Quotient of the new eigenvectors,
      calculating the eigenvectors corresponding to the newly estimated eigenvalues, and
      iterating between estimates of the eigenvalues and the eigenvectors until convergence is obtained, or the maximum number of iterations is exceeded.

13. A method as claimed in claim 12 further comprising the step of reducing the difference between the orientations if the maximum number of iterations is exceeded.

14. A method of computer simulation of magnetic resonance spectra, including the steps of:
   calculating eigenvalues and eigenvectors at an initial orientation defined by a pair of Euler angles,
   locating resonant magnetic field positions at the initial orientation, and
   tracing resonant transitions from the initial orientation to a new orientation calculating the corresponding eigenvalues and eigenvectors at the new orientation using homotopy, and
   locating the resonant magnetic field positions at the new orientation by the use of homotopy; and
   wherein the step of locating resonant magnetic field positions at the new orientation includes:
      calculating a spatial derivative of the magnetic field for constant Euler angles,
      approximating the resonant field position,
      calculating energy values from the approximated resonant field position using the Rayleigh Quotient method and checking the resonant condition, and
      repeating the above steps in an iterative process until the resonance condition is satisfied, or a predetermined maximum number of steps is exceeded.

* * * * *